(12) United States Patent
Park

(10) Patent No.: US 7,927,930 B2
(45) Date of Patent: Apr. 19, 2011

(54) METHOD FOR FABRICATING A LIQUID CRYSTAL DISPLAY DEVICE

(75) Inventor: Yong In Park, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/591,222

(22) Filed: Nov. 12, 2009

(65) Prior Publication Data
US 2010/0062557 A1 Mar. 11, 2010

Related U.S. Application Data

(62) Division of application No. 11/203,423, filed on Aug. 15, 2005, now Pat. No. 7,638,801.

(30) Foreign Application Priority Data

Aug. 13, 2004 (KR) .................. 10-2004-0063923

(51) Int. Cl.
*H01L 21/00* (2006.01)
(52) U.S. Cl. .......... 438/149; 438/151; 438/157; 257/72; 257/E51.005; 257/E29.151
(58) Field of Classification Search .................. 438/149, 438/157, 151; 257/59, 72, 347, E51.005, 257/E29.151
See application file for complete search history.

(56) References Cited

U.S. PATENT DOCUMENTS

| | | | |
|---|---|---|---|
| 5,712,495 A | 1/1998 | Suzawa | |
| 6,031,249 A | 2/2000 | Yamazaki et al. | |
| 6,195,140 B1 * | 2/2001 | Kubo et al. | 349/44 |
| 6,281,552 B1 | 8/2001 | Kawasaki et al. | |
| 6,403,409 B1 | 6/2002 | You | |
| 6,429,485 B1 | 8/2002 | Ha et al. | |
| 6,451,630 B2 | 9/2002 | Lee | |
| 6,512,271 B1 | 1/2003 | Yamazaki et al. | |
| 6,617,203 B2 | 9/2003 | Kim et al. | |
| 6,753,235 B2 | 6/2004 | So et al. | |
| 6,803,601 B2 | 10/2004 | Nakajima | |
| 6,887,744 B2 * | 5/2005 | Hotta | 438/151 |
| 7,414,691 B2 * | 8/2008 | Park et al. | 349/147 |
| 7,612,836 B2 * | 11/2009 | Park et al. | 349/39 |
| 2002/0142554 A1 * | 10/2002 | Nakajima | 438/301 |
| 2005/0134752 A1 * | 6/2005 | Yang et al. | 349/42 |

FOREIGN PATENT DOCUMENTS

| | | |
|---|---|---|
| KR | 1019970003717 B1 | 3/1997 |
| KR | 1019970008589 B1 | 5/1997 |
| KR | 1019970011966 B1 | 8/1997 |

(Continued)

*Primary Examiner* — Khiem D Nguyen
(74) *Attorney, Agent, or Firm* — McKenna Long & Aldridge LLP

(57) ABSTRACT

A method for fabricating an LCD device includes forming an active layer having a source region, a drain region and a channel region on the first substrate; forming first and second conductive layers on the first substrate; forming a gate electrode, a gate line and a pixel electrode by patterning the first and second conductive layers, the gate electrode and the gate line being formed as a dual layer having the first and second conductive layers and the pixel electrode being formed of the first conductive layer; forming a contact hole exposing a portion of the source and drain regions; forming a source and drain electrodes electrically connected to the source and drain regions through the contact hole; and forming a liquid crystal layer between the first and second substrates.

13 Claims, 15 Drawing Sheets

FOREIGN PATENT DOCUMENTS

| | | |
|---|---|---|
| KR | 100161461 B1 | 8/1998 |
| KR | 0175408 | 2/1999 |
| KR | 0177785 | 3/1999 |
| KR | 0184509 | 4/1999 |
| KR | 10-0192593 | 7/1999 |
| KR | 1020000025565 A | 5/2000 |
| KR | 1020000026894 A | 5/2000 |
| KR | 1020000026895 A | 5/2000 |
| KR | 1020000031451 A | 6/2000 |
| KR | 1020000041223 A | 7/2000 |
| KR | 1020000075031 A | 12/2000 |
| KR | 1020010019665 A | 3/2001 |
| KR | 1020010019668 A | 3/2001 |
| KR | 100297706 B1 | 5/2001 |
| KR | 1020010054739 A | 7/2001 |
| KR | 1020010055071 A | 7/2001 |
| KR | 1020010056037 A | 7/2001 |
| KR | 1020010110917 A | 12/2001 |
| KR | 1020020009188 A | 2/2002 |
| KR | 1020020022258 A | 3/2002 |
| KR | 1020020071061 A | 9/2002 |
| KR | 1020020071062 A | 9/2002 |
| KR | 1020020074897 A | 10/2002 |
| KR | 1020020078116 A | 10/2002 |
| KR | 1020020079196 A | 10/2002 |
| KR | 1020020080202 A | 10/2002 |
| KR | 1020030006619 A | 1/2003 |
| KR | 1020030030286 A | 4/2003 |
| KR | 10-2003-0075921 A | 9/2003 |

* cited by examiner

METHOD FOR FABRICATING A LIQUID CRYSTAL DISPLAY DEVICE

This application is a divisional application of U.S. patent application Ser. No. 11/203,423, filed Aug. 15, 2005, now issued as U.S. Pat. No. 7,638,801, which claims the benefit of Korean Patent Application No. 2004-63923, filed on Aug. 13, 2004, all of which are hereby incorporated by reference for all purposes as if fully set forth herein.

BACKGROUND OF THE INVENTION

1. Field of the Invention

The present invention relates to a liquid crystal display (LCD) device and its fabrication method and, more particularly, to an LCD device and its fabrication method capable of simplifying a fabrication process and enhancing a production yield by reducing the number of masks used for fabrication of a polycrystalline silicon thin film transistor.

2. Discussion of the Related Art

As the demand for information displays and applications for portable information devices increase, thin film type flat panel display (FPD) devices have been actively researched and developed. Of the various types of FPD devices, LCD devices are particularly useful as the LCD panels provided therein reproduce images at high resolution and excellent color quality. Accordingly, LCD devices are often incorporated within notebook computers, desktop monitors, and the like.

LCD panels typically include a color filter substrate, an array substrate bonded to the color filter substrate, and a liquid crystal layer formed between the color filter and array substrates. The array substrate typically includes a plurality of switching devices (i.e., thin film transistors (TFT)) arranged in a matrix pattern. Each TFT generally includes a thin film of amorphous or polycrystalline silicon as an active pattern through which a channel is selectively defined.

FIG. 1 illustrates a partial plan view of a related art array substrate. The related art array substrate includes a plurality of pixels, each defined by a crossing of a plurality of gate lines and data lines. For simplicity in illustration, only one pixel of the related art array substrate will be discussed with respect to FIG. 1.

Referring to FIG. 1, the array substrate 10 supports horizontally oriented gate lines 16 and vertically oriented data lines 17 defining a pixel region. A TFT is formed at the crossing of a gate line 16 and a corresponding data line 17 and a pixel electrode 18 is formed within each pixel region.

The TFT includes a gate electrode 21 connected to the gate line 16, a source electrode 22 connected to the data line 17, a drain electrode 23 connected to the pixel electrode 18, and an active pattern 24 formed of polycrystalline silicon, through which a conductive channel region is defined between the source and drain electrodes 22 and 23 when a gate voltage is supplied to the gate electrode 21.

A pair of first contact holes 40A are formed through first and second insulation layers (not illustrated) to enable electrical connection between the source electrode 22 and a source region of the active pattern 24 as well as between the drain electrode 23 and a drain region of the active pattern 24. A second contact hole 40B is formed through a third insulation layer (not illustrated) to enable electrical connection between the drain electrode 23 and the pixel electrode 18.

Having described the array substrate above, an exemplary method of fabricating the related art array substrate according to a related art process will now be described in greater detail with reference to FIGS. 2A to 2F.

Referring to FIG. 2A, an active pattern 24 is formed by depositing a polycrystalline silicon thin film on a substrate 10 and, in a first photolithography process, patterning the as-deposited thin film.

Referring to FIG. 2B, a first insulation layer 15A and a conductive metal layer are sequentially deposited over the entire surface of the substrate 10 and on the active pattern 24. After being deposited, the conductive metal layer is patterned in a second photolithography process to form the gate electrode 21 over the active pattern 24 with the first insulation layer 15A interposed therebetween.

Subsequently, p+ type or n+ type source/drain regions 24A and 24B are formed at predetermined regions of the active pattern 24 by implanting impurity ions at a high density using the gate electrode 21 as a mask. Thus, the source/drain regions 24A/24B, separated by a channel region 24C, ohmically contact subsequently formed source/drain electrodes.

Referring to FIG. 2C, a second insulation layer 15B is deposited over the entire surface of the substrate 10 and on the gate electrode 21. The first and second insulation layers 15A and 15B are then patterned in a third photolithography process removed to form a pair of first contact holes 40A that exposes portions of the source/drain regions 24A/24B.

Referring to FIG. 2D, a conductive metal layer is then formed on the entire surface of the substrate 10 and patterned in a fourth photolithography process to simultaneously form the source and drain electrodes 22 and 23, each contacting the respective ones of the source and drain regions 24A and 24B via the pair of first contact holes 40A. As illustrated, a portion of the conductive metal layer is patterned so as to extend from the source electrode 22, thereby forming the data line 17.

Referring to FIG. 2E, a third insulation layer 15C is deposited on the entire surface of the substrate 10 and is patterned in a fifth photolithography process to form a second contact hole 40B, exposing a portion of the drain electrode 23.

Finally, and with reference to FIG. 2F, a transparent conductive metal layer is formed on the entire surface of the substrate 10 with the third insulation layer 15C formed thereon and patterned in a sixth photolithographic masking process to form a pixel electrode 18 connected with the drain electrode 23.

As discussed above, the related art method of fabricating array substrate that incorporate polycrystalline silicon TFTs illustrated in FIG. 1 requires six photolithography processes to form the active pattern 24, the gate electrode 21, the pair of first contact holes 40A, the source/drain electrodes 24A/24B, the second contact hole 40B, and the pixel electrode 18. The photolithography process according to the related art requires many sub-processes such as cleaning, photoresist deposition, exposure with expensive masks, developing, etching, stripping, inspection, etc. Thus, any method of fabricating array substrates that uses the plurality of photolithography processes may result in reduced production yield and increase the cost of fabrication.

SUMMARY OF THE INVENTION

Accordingly, the present invention is directed to a liquid crystal display device and a fabrication method thereof that substantially obviates one or more of the problems due to limitations and disadvantages of the related art.

Therefore, one advantage of the present invention is to provide an LCD device and its fabrication method capable of reducing the number of masks to be used for fabrication of a thin film transistor (TFT) by simultaneously forming a gate electrode, a gate line and a pixel electrode.

Another advantage of the present invention is to provide an LCD device and its fabrication method capable of preventing a defective disconnection between a drain electrode and a pixel electrode due to an undercut at an edge of the pixel electrode by removing a gate metal of an upper portion of a pixel electrode using diffraction exposure in forming a pixel electrode.

To achieve these and other advantages and in accordance with the purpose of the present invention, as embodied and broadly described herein, there is provided a method for fabricating an LCD device including: providing first and second substrates; forming an active layer having a source region, a drain region and a channel region on the first substrate; forming a first insulation layer on the first substrate; forming first and second conductive layers on the first substrate; forming a gate electrode, a gate line and a pixel electrode by patterning the first and second conductive layers, the gate electrode and the gate line being formed as a dual layer having the first and second conductive layers and the pixel electrode being formed of the first conductive layer; forming a second insulation layer on the first substrate; forming a contact hole exposing a portion of the source and drain regions by removing a portion of the first and second insulation layers and removing the second insulation layer of the upper portion of the pixel electrode; forming a source and drain electrodes electrically connected to the source and drain regions through the contact hole; and forming a liquid crystal layer between the first and second substrates.

In order to achieve the above advantages, there is also provided a liquid crystal display (LCD) device including: first and second substrates; an active layer on the first substrate; a first insulation layer on the first substrate; a gate electrode, a gate line and a pixel electrode, the gate electrode and the gate line having first and second conductive layers and the pixel electrode having the first conductive layer; a second insulation layer on the first substrate, the second insulation layer having a contact hole; a source electrode and a drain electrode on the first substrate, the source electrode being connected with a source region through the contact hole and the drain electrode being connected with a drain region and a portion of the drain electrode being substantially directly connected with a surface of the pixel electrode; and a liquid crystal layer between the first and second substrates.

The foregoing and other features, aspects and advantages of the present invention will become more apparent from the following detailed description of the present invention when taken in conjunction with the accompanying drawings.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings. An exemplary LCD device and its fabrication method in accordance with exemplary embodiments of the present invention will now be described with reference to the accompanying drawings.

Figure 1:
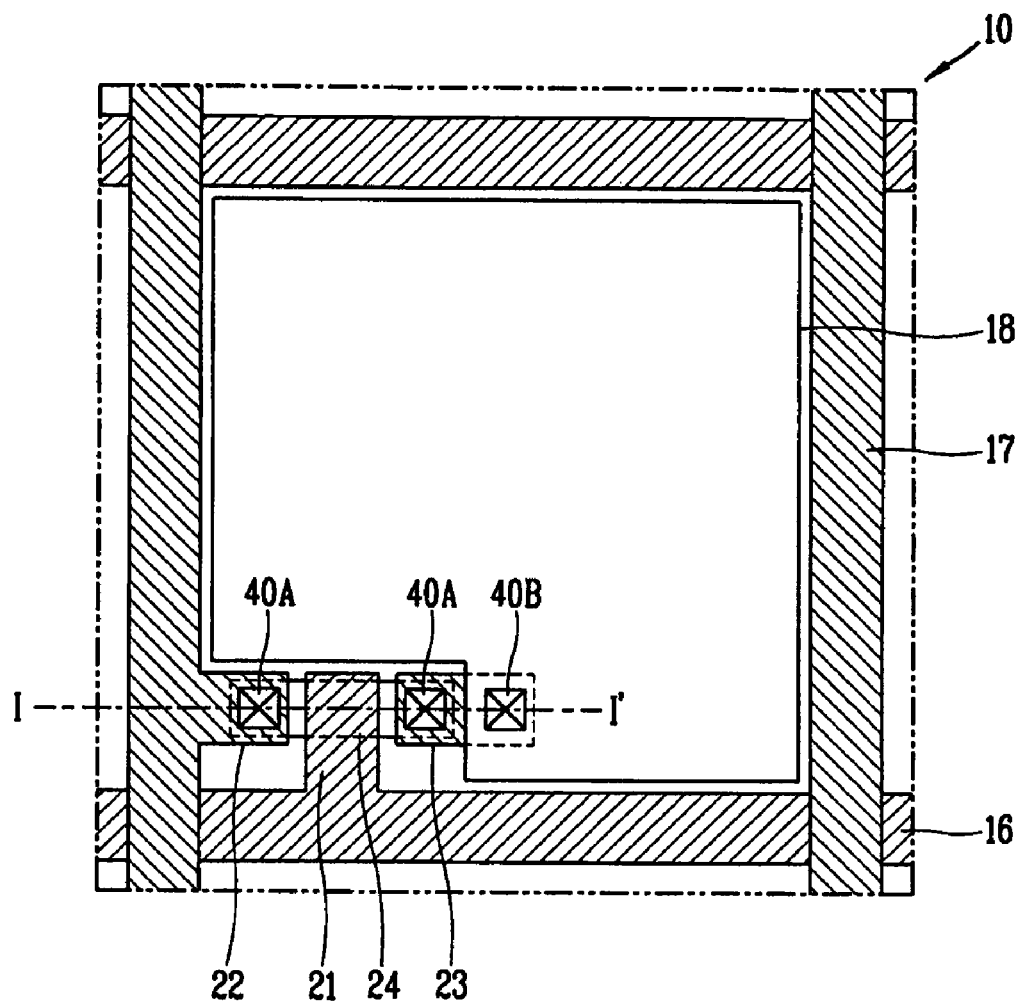
FIG. 1 is a plan view illustrating a portion of an array substrate of a related art LCD device.
Figure 2A:
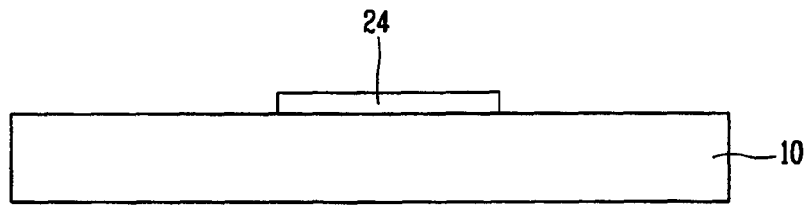
FIGS. 2A to 2F are sequential sectional view illustrating a process of fabricating the array substrate taken along line I-I' of FIG. 1.
Figure 2B:
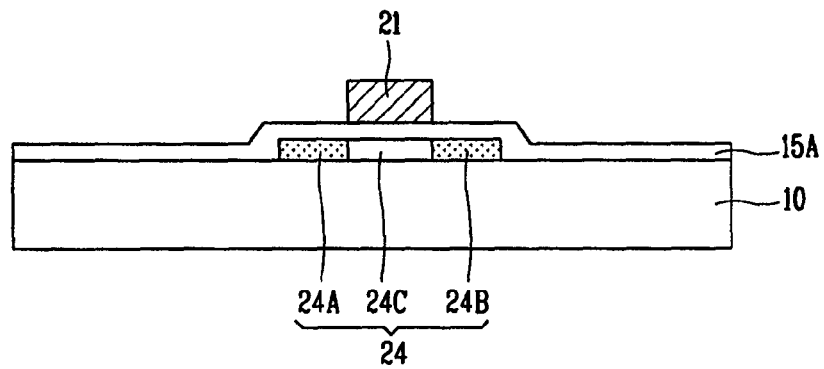
Figure 2C:
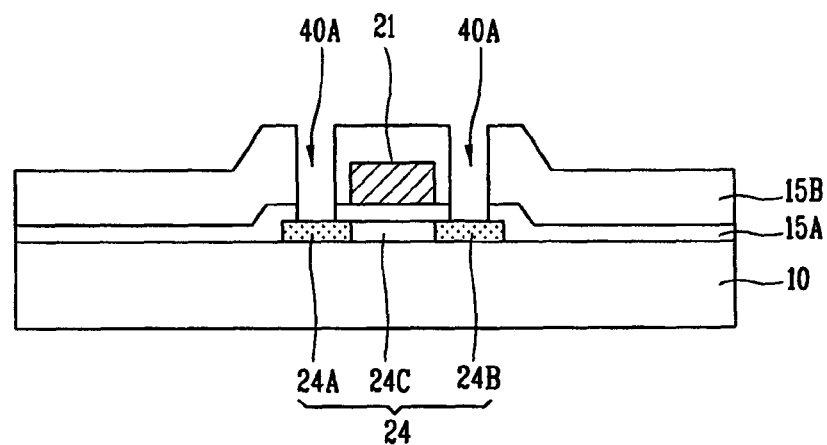
Figure 2D:
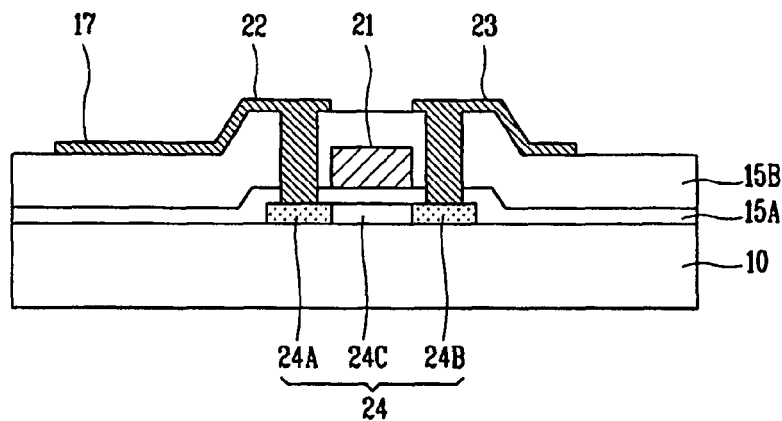
Figure 2E:
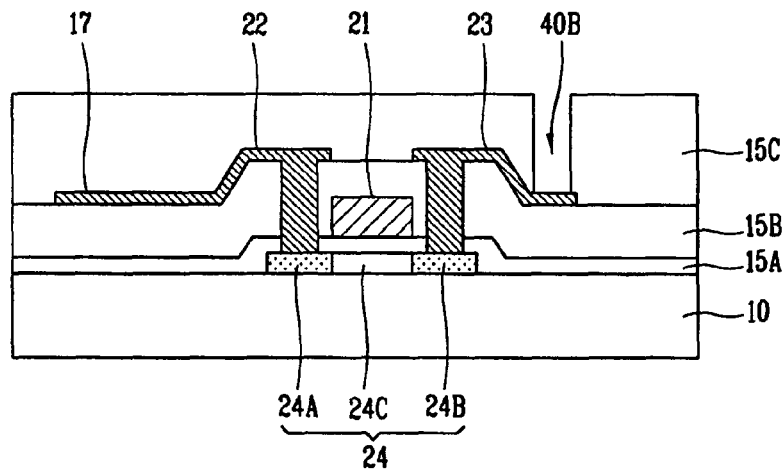
Figure 2F:
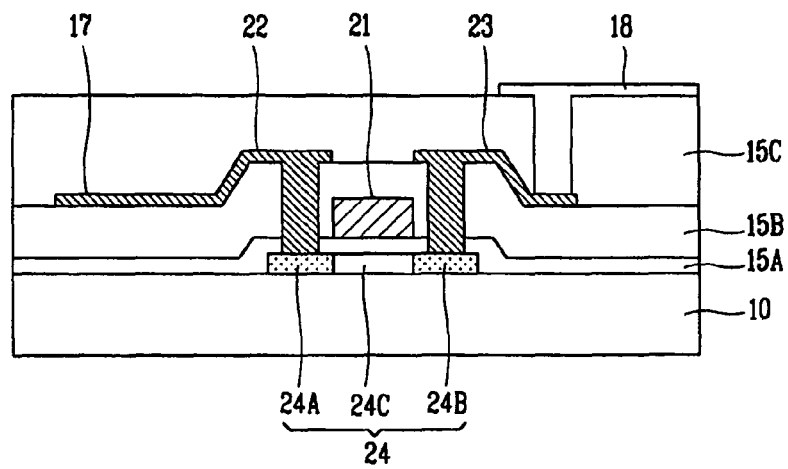
Figure 3:
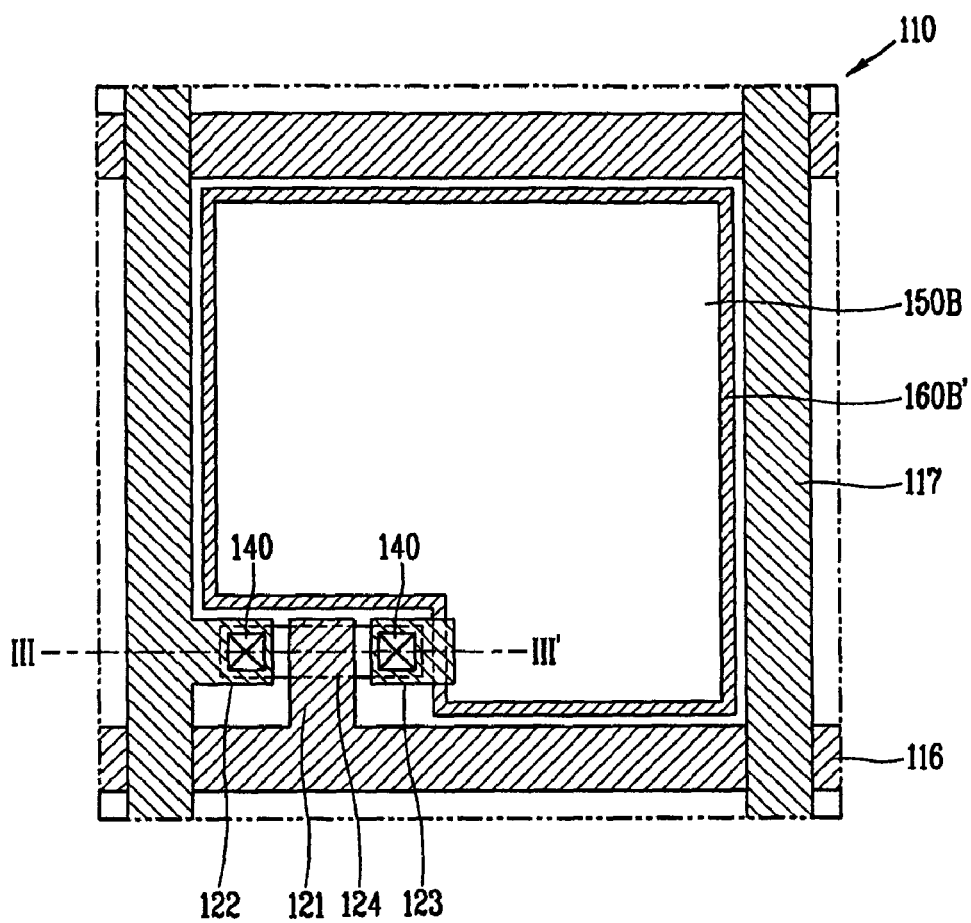
FIG. 3 is a plan view illustrating a portion of an array substrate of an LCD device in accordance with the first embodiment of the present invention.

FIG. 3 is a plan view illustrating a portion of an array substrate of an LCD device in accordance with the first embodiment of the present invention, particularly illustrating one pixel including a thin film transistor (TFT). Although an actual LCD device includes the M×N number of pixels where the N number of gate lines and the M number of data lines cross, only one pixel is illustrated in FIG. 3 for the sake of explanation and clarity of illustration.

In this exemplary embodiment, a polycrystalline silicon TFT using a polycrystalline silicon thin film as a channel layer is illustrated and discussed. However, the present invention is not limited thereto and an amorphous silicon thin film may be used as the channel layer of the TFT in the alternative.

As illustrated, a gate line 116 and a data line 117 are arranged vertically and horizontally, respectively, on the array substrate 110, defining a pixel region at each gate and data line crossing. In addition, a TFT as a switching device is formed at the crossings of the gate line 116 and the data line 117, and a pixel electrode 150B connected with the TFT and driving liquid crystal (not illustrated) together with a common electrode of a color filter substrate (not illustrated) is formed in the pixel region.

The gate line 116 including a gate electrode 121 and the pixel electrode 150B are patterned simultaneously in the same masking process. The gate electrode 121 and the gate line 116 are formed as a dual layer having first and second conductive layers, while the pixel electrode 150B is formed as a single layer of the first conductive layer.

The TFT includes a gate electrode 121 connected with the gate line 116, a source electrode 122 connected with the data line 117 and a drain electrode 123 connected with the pixel electrode 150B. In addition, the TFT also includes first and second insulation layers (not illustrated) for insulating the gate electrode 121 and the source/drain electrodes 122 and 123, and an active pattern 124 for forming a conductive channel between the source electrode 122 and the drain electrode 123 by a gate voltage supplied to the gate electrode 121.

The source electrode 122 is electrically connected with a source region of the active pattern 124 and the drain electrode 123 is electrically connected with a drain region of the active pattern 124 through a contact hole 140 formed at the first and second insulation layers. A portion of the source electrode 122 is connected with the data line 117 to form a portion of the data line 117 and a portion of the drain electrode 123 extends toward the pixel region to be electrically connected with the pixel electrode 150B through a conductive layer pattern 160B'.

That is, the conductive layer pattern 160B' formed of a gate metal (namely, a conductive material constituting the gate electrode 121 and the gate line 116) remains at an edge of the pixel electrode 150B to electrically connect the drain electrode 123 and the pixel electrode 150B, and as stated above, by simultaneously forming the pixel electrode 150B together with the gate electrode 121 and the gate line 116 on the same layer, the number of masks used for fabricating the TFT may be reduced, which will now be described in detail through a process for fabricating the array substrate.

FIGS. 4A to 4D are sequential sectional views illustrating a process of fabricating the array substrate taken along line III-III' of FIG. 3.

Figure 4A:
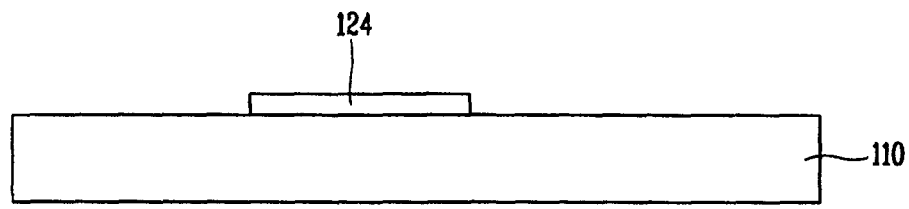
FIGS. 4A to 4D are sequential sectional views illustrating a process of fabricating the array substrate taken along line III-III' of FIG. 3.

As illustrated in FIG. 4A, the active pattern 124 is formed as a silicon layer on the substrate 110 formed of a transparent insulation material such as glass using a photolithography process (a first masking process).

In this case, a buffer layer may be formed as a silicon oxide film (SiO2) on the substrate 110, on which the active pattern 124 may be formed. The buffer layer serves to prevent infiltration of an impurity such as natrium (Na) existing in the glass substrate 110 into an upper layer during a process.

The silicon layer may be formed as an amorphous silicon thin film or a crystallized silicon thin film, and in the present invention, the TFT is formed using the crystallized polycrystalline silicon thin film. The polycrystalline silicon thin film may be formed using various crystallizing methods after the amorphous silicon thin film is formed on the substrate, which will be described as follows.

First, the amorphous silicon thin film may be deposited or formed according to a number of different methods, such as low pressure chemical vapor deposition (LPCVD) and plasma enhanced chemical vapor deposition (PECVD).

Thereafter, in order to remove hydrogen atoms existing in the amorphous silicon thin film, dehydrogenation process is performed and then crystallization is performed thereon. In order to crystallize the amorphous silicon thin film, solid phase crystallization (SPC) in which the amorphous silicon thin film is thermally treated in a high temperature furnace or examiner laser annealing (ELA) using laser can be used.

As the laser crystallization, the ELA using laser in a pulse form is commonly used, and recently, research is ongoing on sequential lateral solidification (SLS) which remarkably improves crystallization characteristics by making grains grow laterally (in a horizontal direction).

The SLS uses the fact that grains are grown in a vertical direction to an interface of liquid phase silicon and solid phase silicon at the interface. By growing grains to a certain length laterally by suitably controlling a size of a laser energy and laser beam irradiation range, the size of silicon grains may be enhanced.

Figure 4B:
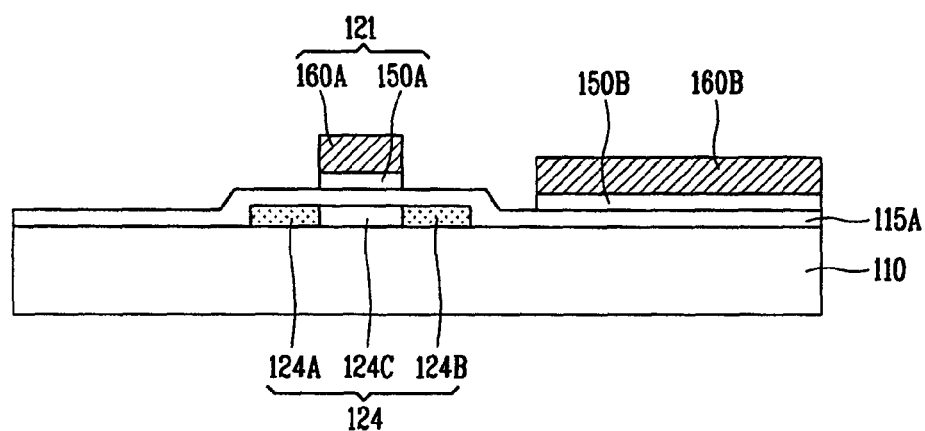
Figure 4C:
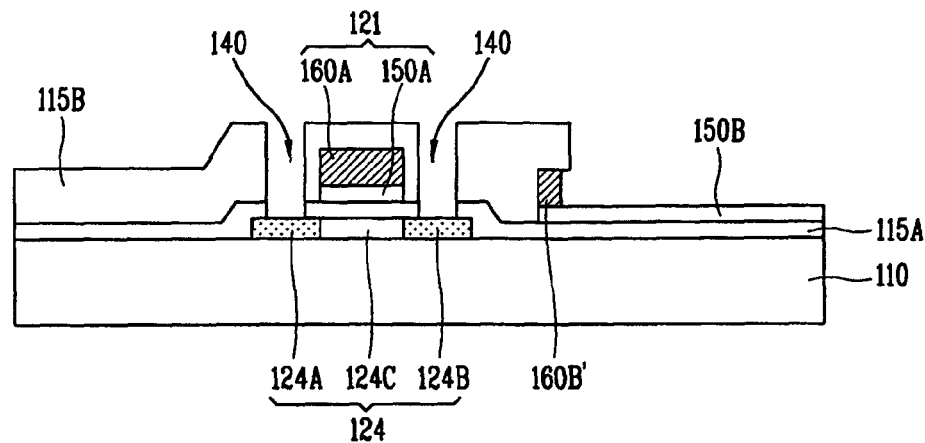

FIGS. 4B and 4C illustrate the process of simultaneously forming the gate electrode, the gate line and the pixel electrode in accordance with the first embodiment of the present invention, which will now be described with reference to FIGS. 5A and 5D.

Figure 5A:
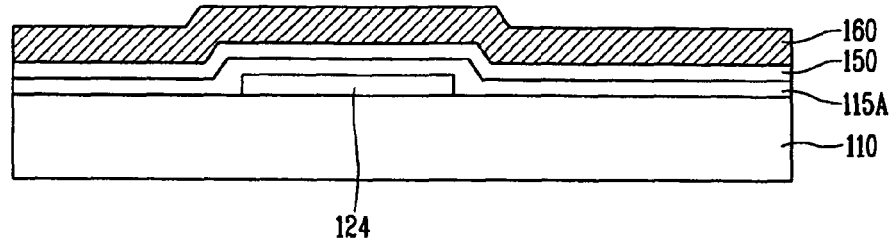
FIGS. 5A to 5D are sectional views illustrating a process of simultaneously forming a gate electrode, a gate line and a pixel electrode in FIGS. 4B and 4C in accordance with the first embodiment of the present invention.

As illustrated in FIG. 5A, a first insulation layer 115A, namely, a gate insulation layer, a first conductive layer 150 and a second conductive layer 160 are sequentially formed on the entire surface of the substrate 110 with the active pattern 124 formed thereon.

The first conductive layer 150 is formed of a transparent conductive material with excellent transmittance, such as indium tin oxide (ITO) or indium zinc oxide (IZO), for forming the pixel electrode, and the second conductive layer 160 is formed of a low-resistance opaque conductive material such as aluminum, an aluminum alloy, tungsten, copper, chromium, molybdenum or the like for forming the gate line including the gate electrode.

Figure 5B:
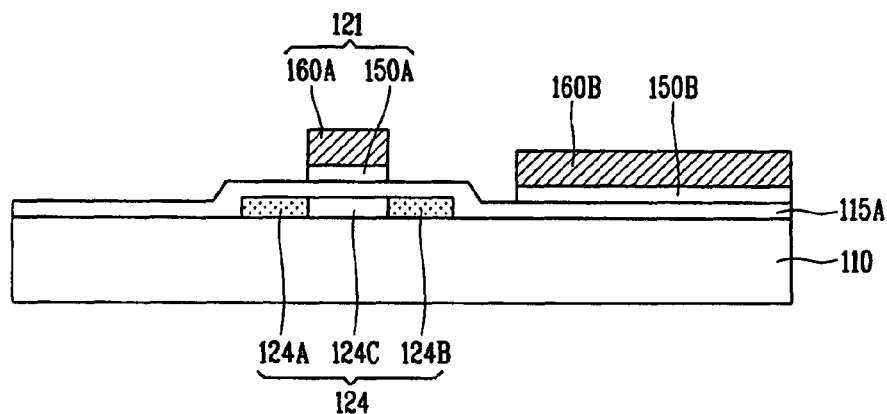

Next, as illustrated in FIG. 5B (or FIG. 4B), the second conductive layer 160 and the first conductive layer 150 are selectively patterned using the photolithography process (a second masking process) in order to form the gate electrode 121, the gate line 116 and the pixel electrode 150B.

The gate electrode 121 includes a first gate electrode pattern 150A formed as a transparent first conductive layer and a second gate electrode pattern 160A formed as an opaque second conductive layer, and a pixel electrode pattern 160B formed as an opaque second conductive layer with the same form as the pixel electrode 150B remains on the pixel electrode 150B formed of the transparent first conductive layer.

Thereafter, an impurity ion (namely, dopant) is injected into certain regions of the active pattern 124 using the gate electrode 121 as a mask to form a source region 124A and a drain region 124B, namely, ohmic contract layers. In this case, the gate electrode 121 serves as an ion stopper preventing infiltration of the dopant into the channel region 124C of the active pattern 124.

Electrical characteristics of the active pattern 124 may be changed according to a type of the injected dopant, and if the implanted dopant corresponds to a 3-group element such as boron (B), it operates as a P-type TFT, while if the injected dopant corresponds to a 5-group element such as phosphor (P), it operates as an N-type TFT.

After the ion-injection process, a process for activating the implanted dopant may be performed.

Figure 5C:
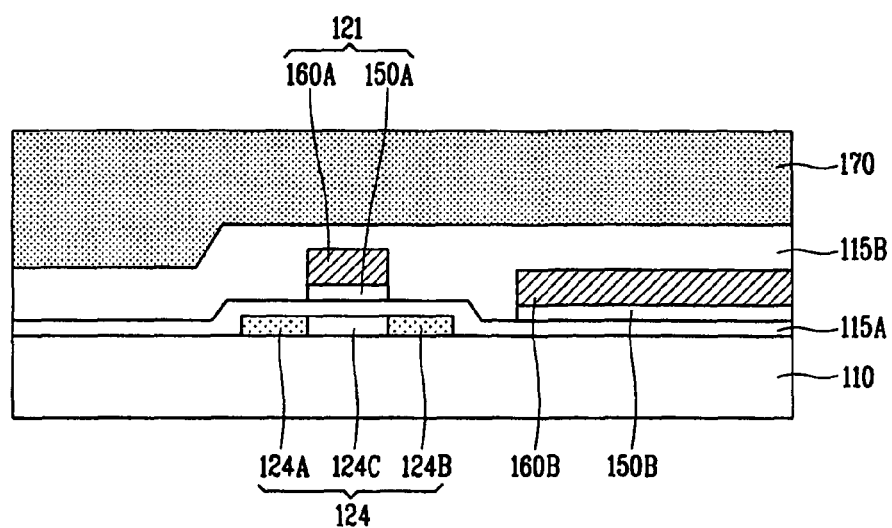

Thereafter, as illustrated in FIG. 5C, a second insulation layer 115B is deposited on the entire surface of the substrate 110 with the gate electrode 121, the gate line 116 and the pixel electrode 150B formed thereon, to form a photosensitive film 170 formed of a photosensitive material such as photoresist.

The second insulation layer 115B may be formed of a transparent organic insulation material such as benzocyclobutene (BCB) or an acrylic resin for a high aperture ratio.

Figure 5D:
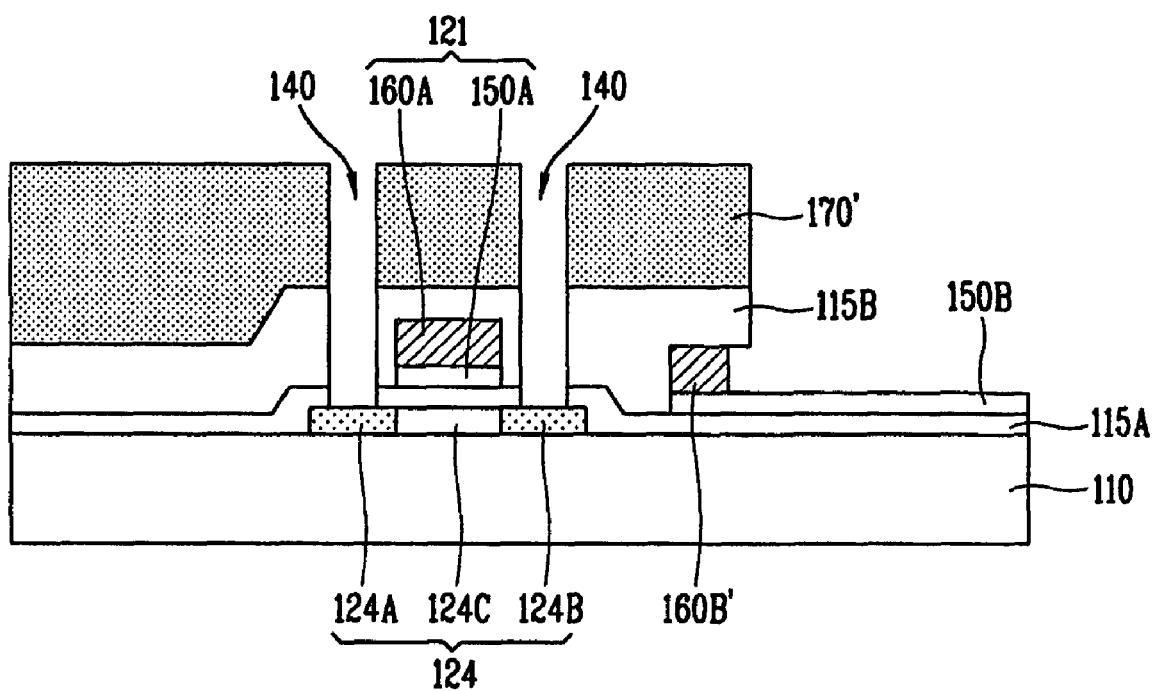

And then, as illustrated in FIG. 5D, light is irradiated on the photosensitive film through the photolithography process (a third masking process) and then the exposed photosensitive film 170 is developed to form a photosensitive film pattern 170' for forming the contact hole and opening the pixel electrode region.

Subsequently, a portion of the second insulation layer 115E and the first insulation layer 115A is removed using the photosensitive film pattern 170' as a mask to form a pair of contact holes 140 exposing a portion of the source/drain regions 124A and 124B of the active pattern 124, and simultaneously, the second insulation layer 115B and the pixel electrode pattern 160B formed as the second conductive layer at the pixel electrode region are removed to expose the surface of the pixel electrode 150B formed as the first conductive layer formed of the transparent conductive material.

Because of the margin of alignment between photolithography equipment and the mask, the pixel electrode region is opened with a certain distance inward from the pixel electrode 150B, leaving the second conductive layer pattern 160B' formed as the second conductive layer at an upper portion of the edge of the pixel electrode 150B.

The pixel electrode pattern 160B remaining at the upper portion of the pixel electrode 150B is not removed using a mask but removed using the pattern of the second insulation layer 115B (or the photosensitive film pattern 170')) so that the pixel electrode region may be simultaneously opened when the contact hole 140 is formed, and in this case, the second conductive layer, namely, the pixel electrode pattern 160B is excessively etched to generate an undercut at the boundary between the second insulation layer 115B at the upper portion of the edge of the pixel electrode 150B and the second conductive layer pattern 160B'.

Thereafter, as illustrated in FIG. 4C, the photosensitive film pattern 170' is removed and then the photolithography process is performed twice to form the gate electrode 121, the gate line 116, the pixel electrode 150B, and the contact hole 140 exposing the source/drain regions 124A and 124B.

Figure 4D:
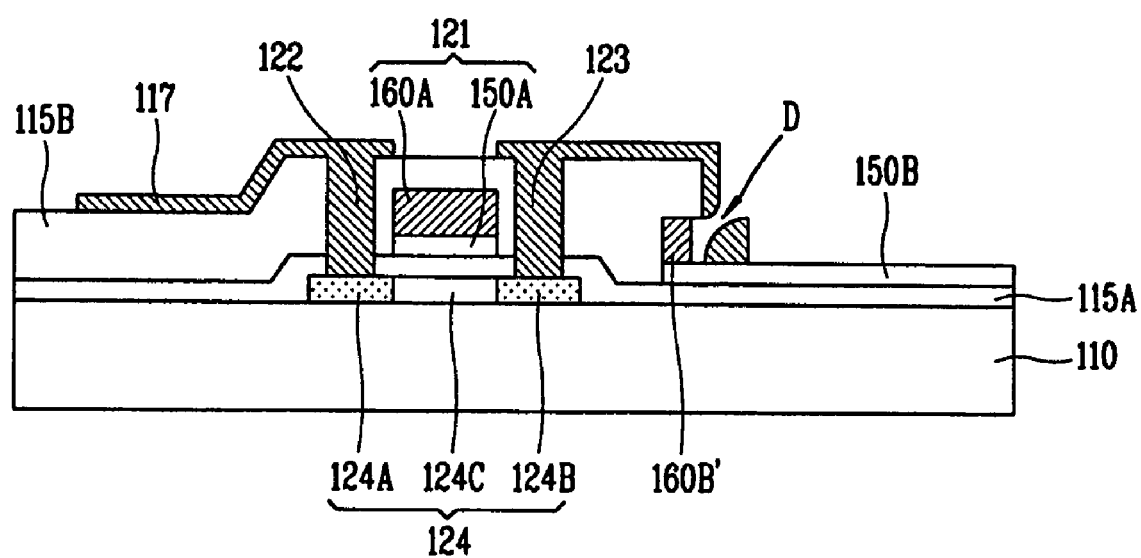

And then, as illustrated in FIG. 4D, a third conductive layer is deposited on the entire surface of the substrate 110 and then patterned using the photolithography process (a fourth masking process) to form the source electrode 122 connected with the source region 124A and the drain electrode 123 connected with the drain region 124B through the contact hole 140.

A portion of the source electrode 122 extends in one direction to form the data line 117 and a portion of the drain electrode 123 extends toward the pixel electrode so as to be connected with the pixel electrode 150B through the second conductive layer pattern 150B' at the upper portion of the pixel electrode 150B. In this case, the drain electrode 123 is directly connected with the pixel electrode 150B, not through a contact hole, so a contact hole forming process is not required and thus one masking process can be omitted.

In the process of fabricating the array substrate in accordance with the first embodiment of the present invention, the gate electrode, the gate line and the pixel electrode are simultaneously patterned and one process for forming contact hole is reduced, so that two times of masking processes are reduced compared with a general fabrication process. Accordingly, the production yield may be increased due to the simplification of the fabrication process and the fabrication cost may be reduced.

However, as illustrated, due to the undercut at the second conductive layer pattern 160B' formed at the upper portion of the edge of the pixel electrode 150B, the drain electrode 123 and the pixel electrode 150B may not be connected.

The disconnection between the drain electrode and the pixel electrode occurs due to the undercut at the second conductive layer pattern formed in the process of removing the opaque second conductive layer at the upper portion of the pixel electrode in the process of forming the contact hole after the gate electrode. The gate line and the pixel electrode are patterned through a single photolithography process for reducing the number of masking processes. Thus, by completely removing the second conductive layer at the upper portion of the pixel electrode using slit exposure in forming the pixel electrode, the disconnection between the drain electrode and the pixel electrode can be prevented. This will now be described with reference to the second exemplary embodiment of the present invention.

Figure 6:
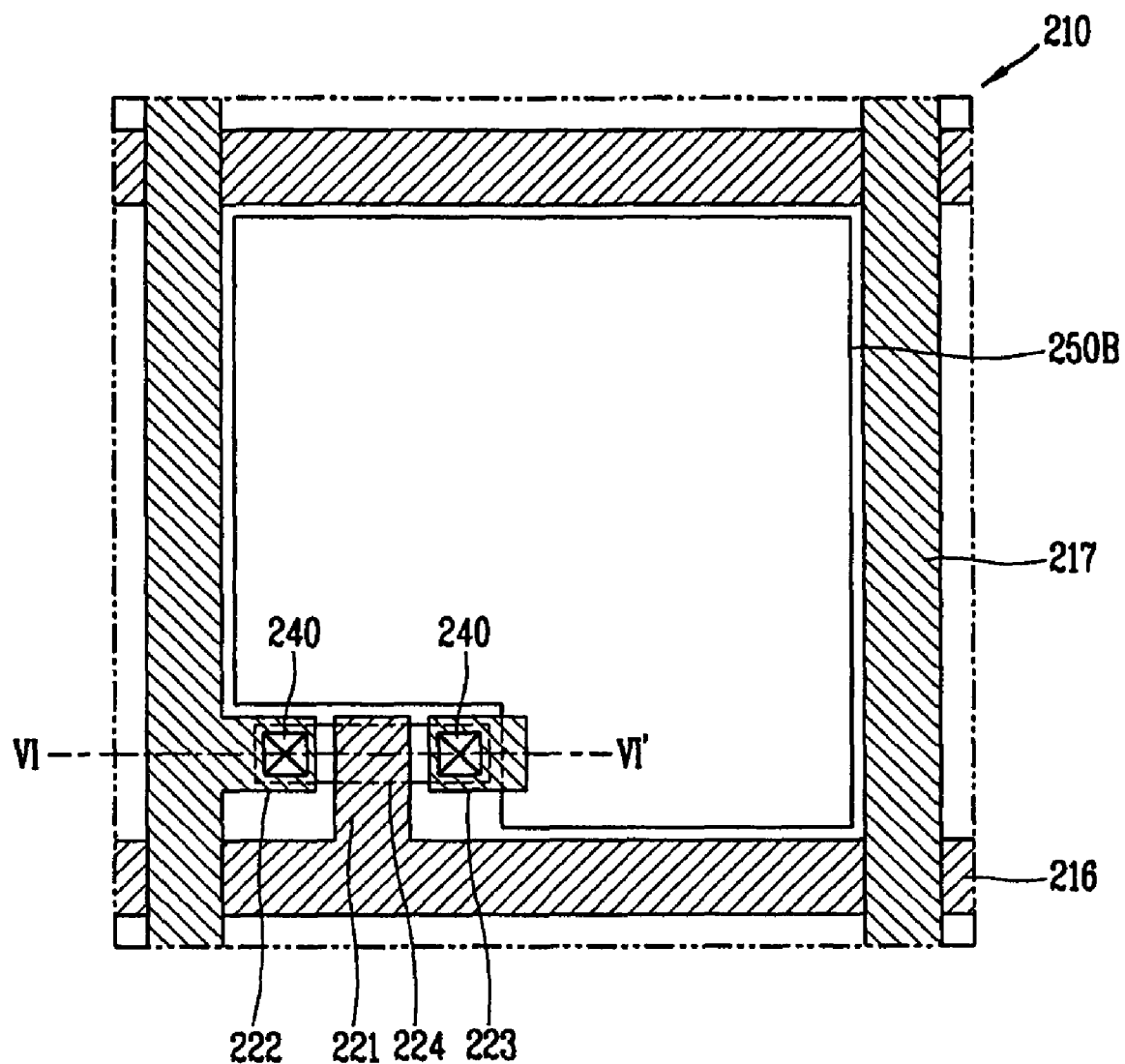
FIG. 6 is a plan view illustrating a portion of an array substrate of an LCD device in accordance with a second embodiment of the present invention.

FIG. 6 is a plan view illustrating a portion of an array substrate of an LCD device in accordance with a second embodiment of the present invention.

In the second embodiment of the present invention, the second conductive layer at the upper portion of the pixel electrode is completely removed using slit exposure in the process of forming the gate electrode, the gate line and the pixel electrode, leaving no second conductive layer pattern on the pixel electrode like in the first embodiment of the present invention, and thus, the drain electrode is directly electrically connected with the pixel electrode. Except for this, the second embodiment of the present invention has the same construction as that of the first embodiment of the present invention.

As illustrated, a gate line 216 and a data line 217 are arranged vertically and horizontally on the array substrate 210, defining a pixel region. In addition, a TFT as a switching device is formed at the crossing of the gate line 216 and the data line 217, and a pixel electrode 250B connected with the TFT and driving liquid crystal (not illustrated) together with a common electrode of a color filter substrate (not illustrated) is formed in the pixel region.

The gate line 216 including a gate electrode 221 and the pixel electrode 250B are simultaneously patterned through the same masking process. The gate electrode 221 and the gate line 216 are formed as a dual layer having first and second conductive layers, while the pixel electrode 250B is formed as a single layer of the first conductive layer.

The TFT includes a gate electrode 221 connected with the gate line 216, a source electrode 222 connected with the data line 217 and a drain electrode 223 connected with the pixel electrode 250B. In addition, the TFT also includes first and second insulation layers (not illustrated) for insulating the gate electrode 221 and the source/drain electrodes 222 and 223, and an active pattern 224 for forming a conductive channel between the source electrode 222 and the drain electrode 223 by a gate voltage supplied to the gate electrode 221.

The source electrode 222 is electrically connected with a source region of the active pattern 224 and the drain electrode 223 is electrically connected with a drain region of the active pattern 224 through a contact hole 240 formed at the first and second insulation layers. A portion of the source electrode 222 is connected with the data line 217 to form a portion of the data line 217 and a portion of the drain electrode 223 extends toward the pixel region so as to be directly connected with the pixel electrode 250B electrically.

At this time, such a conductive layer pattern as in the first embodiment of the present invention does not remain at the edge of the pixel electrode 250B, so the drain electrode 223 may be directly electrically connected with the pixel electrode 250B, thereby preventing disconnection between the drain electrode 223 and the pixel electrode 250B due to undercut of the conductive layer pattern.

In this manner, by substantially simultaneously forming the pixel electrode 250B on the same layer together with the gate electrode 221 and the gate line 216, the number of masks to be used for fabricating the TFT may be reduced, and by previously removing the gate meal at the upper portion of the pixel electrode 250B using the slit exposure in forming the pixel electrode 250B, such disconnection between the drain electrode 223 and the pixel electrode 250B as in the first embodiment of the present invention can be prevented. This will now be described in detail through the process of fabricating the LCD device as follows.

FIGS. 7A to 7D are sequential sectional views illustrating a fabricating process taken along line VI-VI' of the LCD device in FIG. 6 in accordance with the second embodiment of the present invention, and FIGS. 8A to 8D are sequential plan views illustrating the process of fabricating the array substrate in accordance with the second embodiment of the present invention.

Figure 7A:
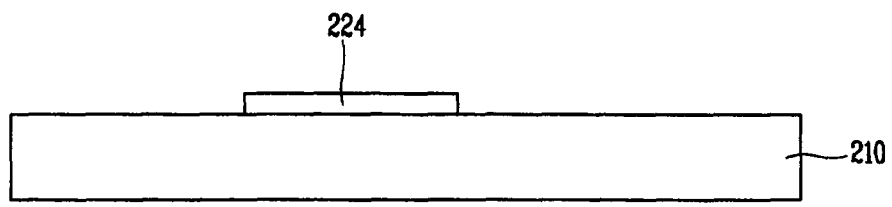
FIGS. 7A to 7D are sequential sectional views illustrating a fabricating process taken along line VI-VI' of the LCD device in FIG. 6 in accordance with the second embodiment of the present invention.
Figure 8A:
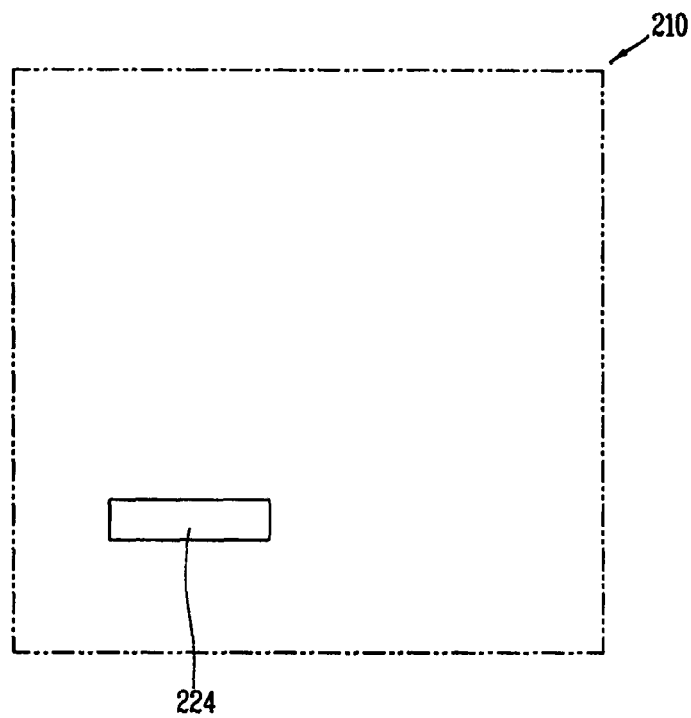
FIGS. 8A to 8D are sequential plan views illustrating the process of fabricating the array substrate in accordance with the second embodiment of the present invention.

As illustrated in FIGS. 7A and 8A, an active pattern 224 formed of a silicon layer is formed on a substrate 210 formed of a transparent insulation material such as glass through a photolithography process (a first masking process).

Figure 7B:
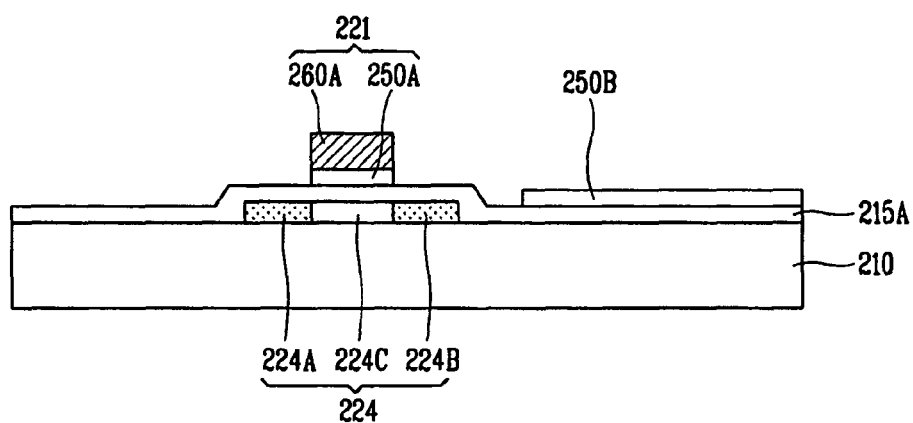
Figure 8B:
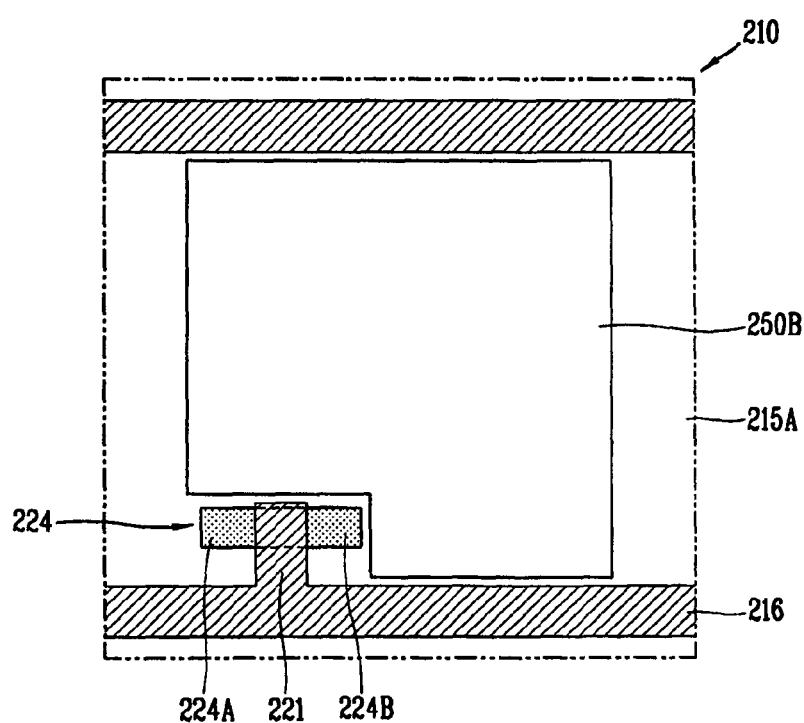

Next, as illustrated in FIGS. 7B and 8B, a first insulation layer 215A and first and second conductive layers are sequentially formed on the entire surface of a substrate 210, and then, the second and first conductive layers are selectively patterned using the photolithography process (a second masking process) to simultaneously form a gate electrode 221, a gate line 216 and a pixel electrode 250B.

The gate electrode 221 includes a first gate electrode pattern 250A formed of a first transparent conductive layer and a second gate electrode pattern 260A formed of a second opaque conductive layer, and the pixel electrode 250B is only formed of the first transparent conductive layer. Such a conductive layer pattern formed of the second opaque conductive layer as in the first embodiment of the present invention does not remain on the upper portion of the pixel electrode 250B.

In order to prevent disconnection between the drain electrode and the pixel electrode due to the undercut of the second conductive layer pattern in accordance with the first embodiment of the present invention, in the second embodiment of the present invention, the second conductive layer at the upper portion of the pixel electrode is completely removed using the slit exposure when the pixel electrode is formed, which will now be described with reference to the accompanying drawings.

FIGS. 9A to 9E are sectional view illustrating a process of forming a gate electrode, a gate line and a pixel electrode in FIG. 7B in accordance with the second embodiment of the present invention.

Figure 9A:
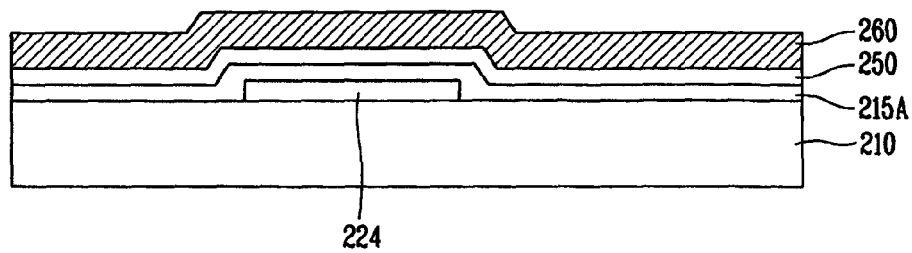
FIGS. 9A to 9E are sectional view illustrating a process of forming a gate electrode, a gate line and a pixel electrode in FIG. 7B in accordance with the second embodiment of the present invention.

As illustrated in FIG. 9A, the first insulation layer 215A as the gate insulation layer and the first and second conductive layers 250 and 260 are sequentially formed on the entire surface of the substrate 210 with the active pattern 225 formed thereon.

The first conductive layer 250 is formed of a transparent conductive material with excellent transmittance, such as indium tin oxide (ITO) or indium zinc oxide (IZO), for forming the pixel electrode, and the second conductive layer 260 is formed of a low-resistance opaque conductive material such as aluminum, an aluminum alloy, tungsten, copper, chromium, molybdenum or the like for forming the gate electrode and the gate line.

The second conductive layer 260 may be formed of the same transparent conductive material as the first conductive layer 250.

Figure 9B:
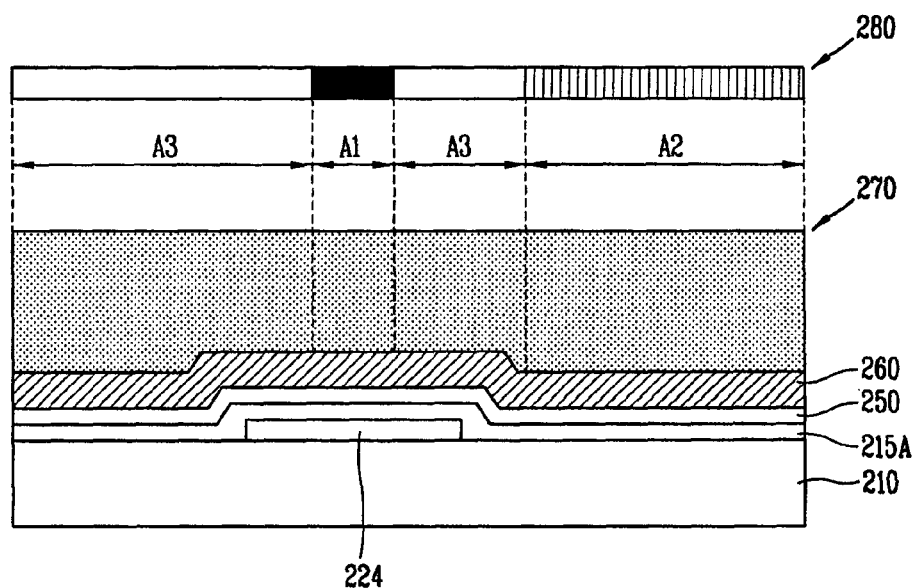

And then, as illustrated in FIG. 9B, a photosensitive film 270 formed of a photosensitive material such as photoresist is formed on the entire surface of the substrate 210, and light is selectively irradiated on the photosensitive film 270 through a slit mask 280.

The slit mask 280 used in this embodiment includes a blocking region A1 for blocking irradiated light, a slit region A2 having a slit pattern and blocking only a portion of light, and a transmission region A3 for transmitting light. Only light which has transmitted through the mask 280 is irradiated on the photosensitive film 270.

Figure 9C:
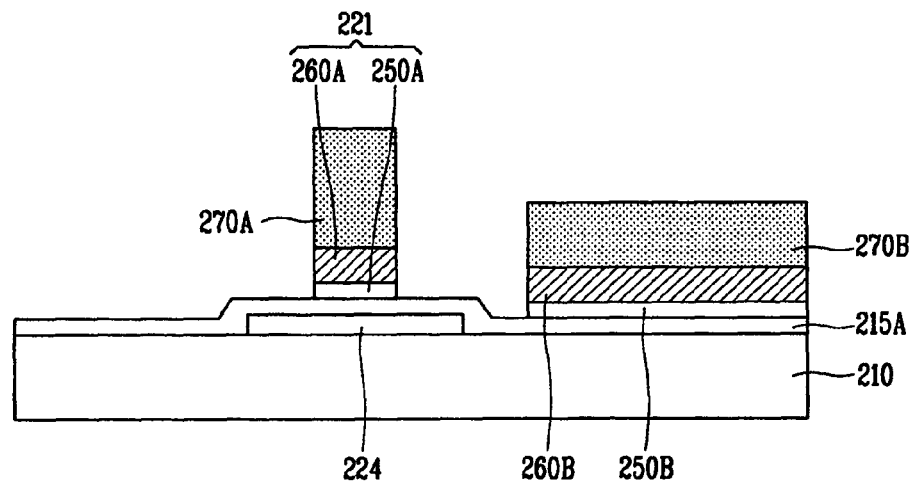

Subsequently, when the photosensitive film 270 exposed through the slit mask 280 is developed, as illustrated in FIG. 9C, photosensitive patterns 270A and 270B with a certain thickness remain on regions where light has been entirely or partially blocked through the blocking region A1 and the slit region A2, and the photosensitive film 270 is completely removed from a region where light has been entirely transmitted through the transmission region A3, exposing the surface of the second conductive layer 260.

The second photosensitive film pattern 270B formed through the slit region A2 is formed thinner than the first photosensitive film pattern 270A formed at the blocking region A1, and the photosensitive film 270 is completely removed from the region to which light has been entirely transmitted through the transmission region A3. In this case, positive photoresist was used, and in the present invention, negative photoresist may be also used without being restricted thereto.

Next, the second and first conductive layers 260 and 250 are selectively removed using the first and second photosensitive film patterns 270A and 270B to form the gate electrode 221 at a certain region of an upper portion of the active pattern 224 and a pixel electrode 250B at the pixel region.

The gate electrode 221 includes the first gate electrode pattern 250A formed of the first transparent conductive layer and the second gate electrode pattern 260A formed of the second opaque conductive layer, and the pixel electrode pattern 260B formed of the second opaque conductive layer patterned in the same form as the pixel electrode 250B remains at the upper portion of the pixel electrode 250B formed of the first transparent conductive layer.

The pixel electrode pattern 260B remaining on the pixel electrode 250B may be removed through an ashing process and an etching process (to be described), and by applying the slit exposure to the patterning of the pixel electrode 250B, the surface of the pixel electrode 250B can be exposed without a masking process or such a defective disconnection according to the unnecessary second conductive layer pattern as in the first embodiment.

Figure 9D:
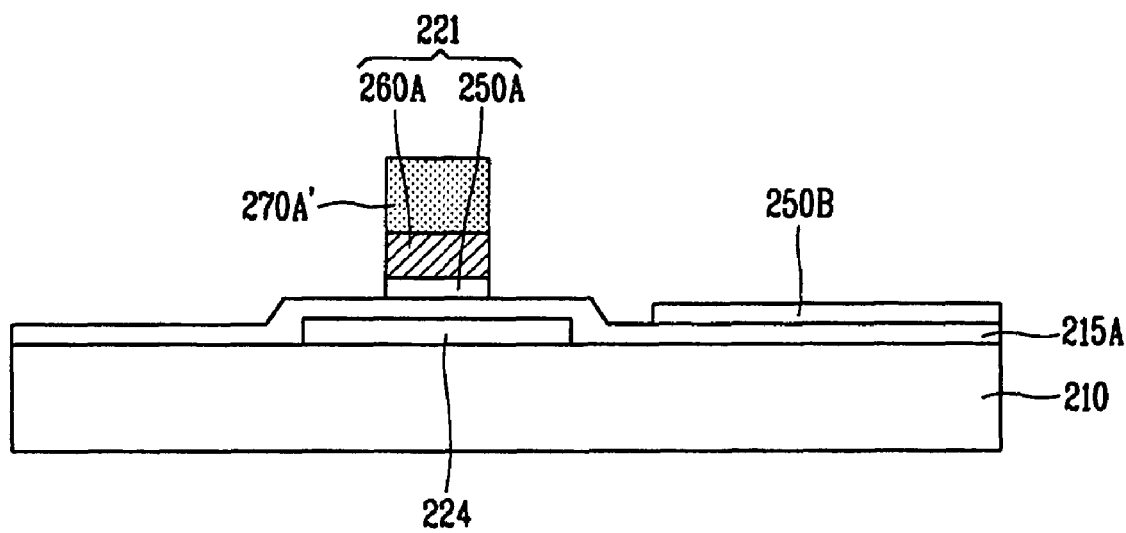

Namely, by performing the ashing process to remove a portion of the photosensitive film patterns 270A and 270B, as illustrated in FIG. 9D, the second photosensitive film pattern 270B of the slit region A2 where the slit exposure has been applied is completely removed from the upper portion of the pixel electrode 250B, exposing the surface of the pixel electrode pattern 260B.

At this time, the first photosensitive film pattern 270A is removed as long as the thickness of the second photosensitive film pattern 270B to remain as a third photosensitive film pattern 270A' on the gate electrode 221 corresponding to the blocking region A1.

Thereafter, the pixel electrode pattern 260B on the pixel electrode 250B is completely removed using the third photosensitive film pattern 270A' as a mask.

Figure 9E:
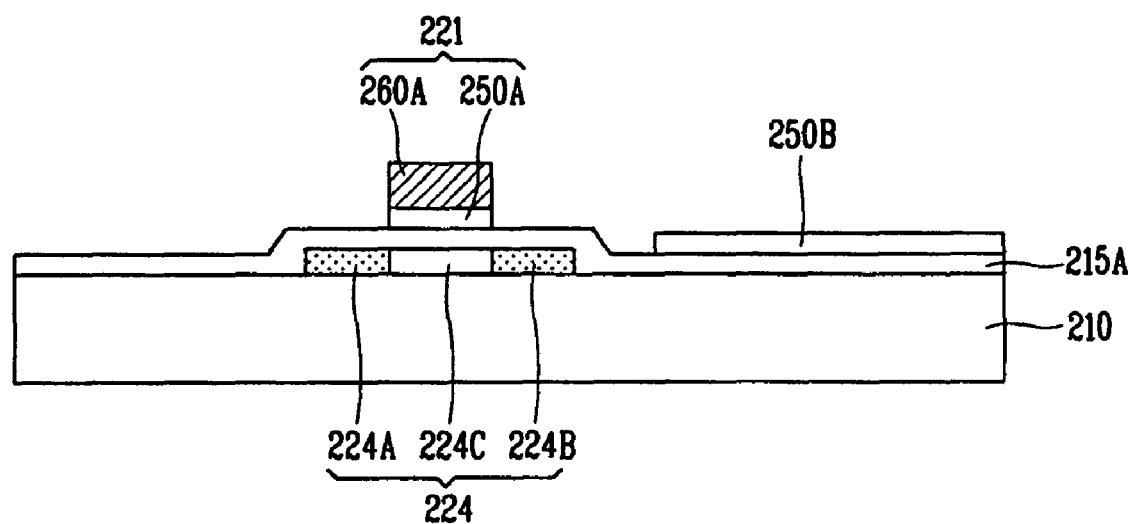

Then, as illustrated in FIG. 9E, the gate electrode 221 formed as the dual layer of the first and the second conductive layers and the pixel electrode 250B are formed on the array substrate 210. Namely, the gate electrode 221 and the pixel electrode 250B may be formed simultaneously through a single photography process using the slit exposure.

Thereafter, an impurity ion is injected to a certain region of the active pattern 224 using the gate electrode 221 as a mask to form a source region 224A and a drain region 224B. This structure is the ohmic contact layer.

Figure 7C:
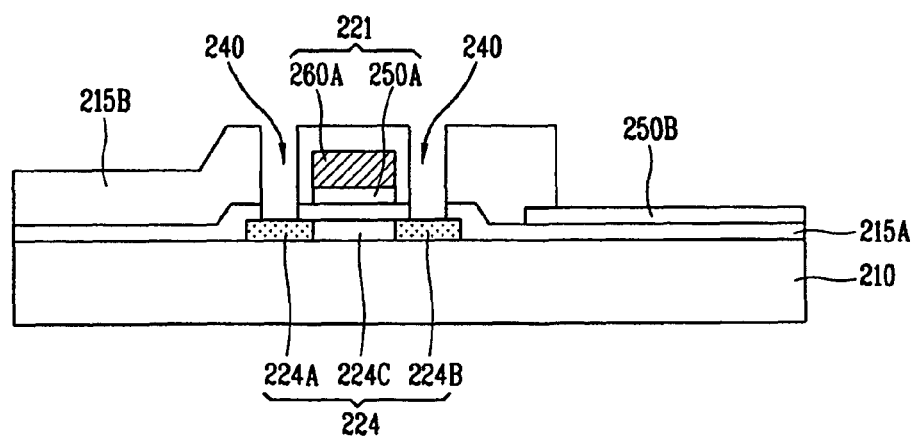
Figure 8C:
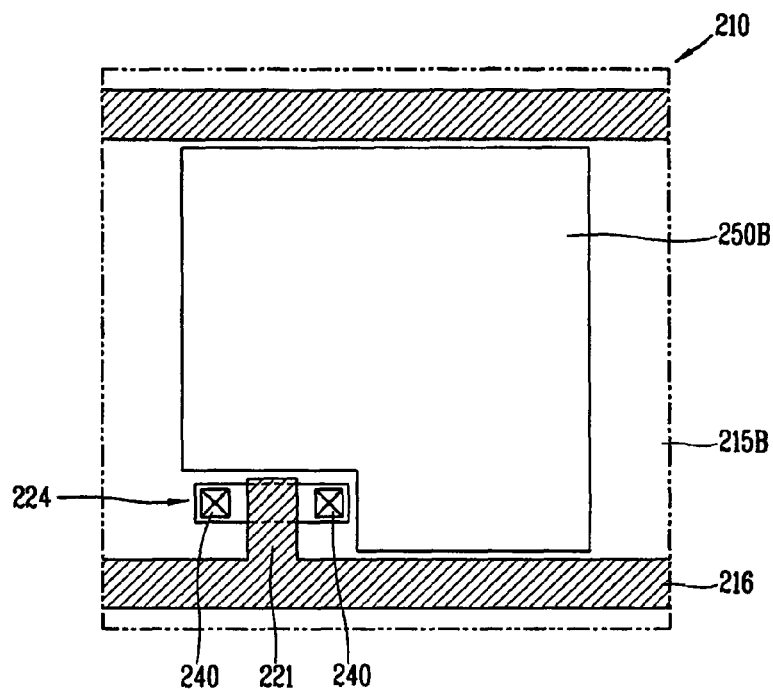

Then, as illustrated in FIGS. 7C and 8C, a second insulation layer 215B is deposed on the entire surface of the substrate 210 on which the gate electrode 221, the gate line 216 and the pixel electrode 250B have been formed, and then, the second and first insulation layers 215B and 215A are selectively patterned through the photolithography process (a third masking process) to form a contact hole at the source/drain regions 224A and 224B and simultaneously open the pixel electrode 250B. At this time, in this embodiment, the slit exposure is applied in the entire process, so that the second conductive layer on the pixel electrode 250B is completely removed to expose the surface of the pixel electrode 250B formed of the first transparent conductive layer.

Figure 7D:
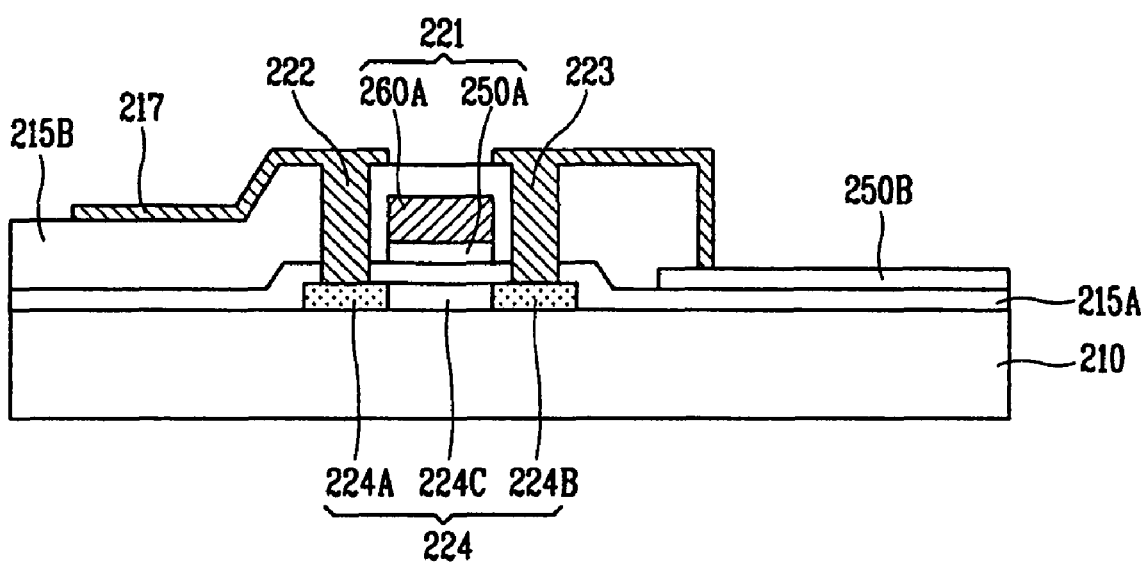
Figure 8D:
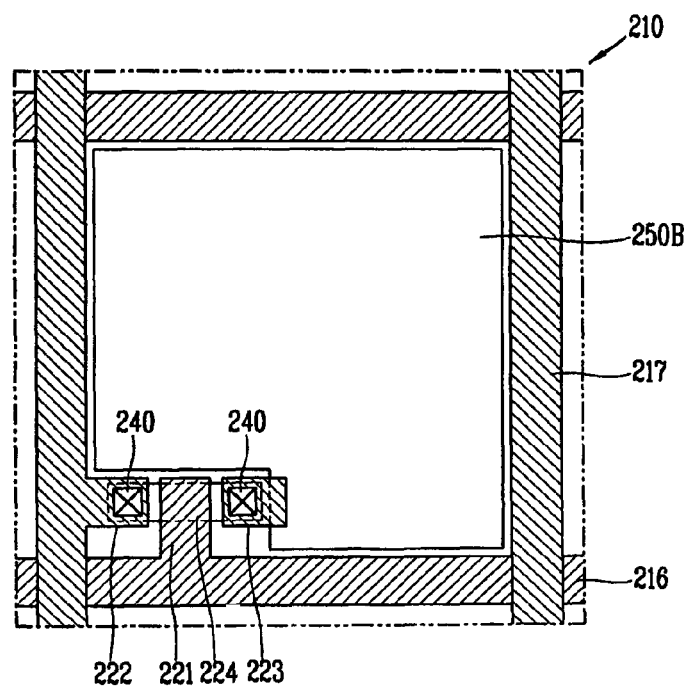

Thereafter, as illustrated in FIGS. 7D and 8D, a third conductive layer is deposited on the entire surface of the substrate 210 and patterned through the photolithography process (a fourth masking process) to form a source electrode 222 electrically connected with the source region 224A and a drain electrode 223 electrically connected with the drain region 224B through the contact hole 240.

The third conductive layer is directly formed on the pixel electrode 250B, and a portion of the drain electrode 223 and the pixel electrode 250B are directly connected through patterning of the source/drain regions 222 and 223, so that such disconnection between the drain electrode and the pixel electrode as in the first embodiment of the present invention does not occur.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display device, comprising:
    providing first and second substrates;
    forming an active layer having a source region, a drain region and a channel region on the first substrate;
    forming a first insulation layer on the first substrate;
    forming first and second conductive layers on the first substrate;
    forming a gate electrode, a gate line and a pixel electrode by patterning the first and second conductive layers through a single photolithography process, the gate electrode and the gate line being formed as a dual layer having the first and second conductive layers and the pixel electrode being formed of the first conductive layer, wherein the first conductive layer is formed of transparent conductive material and the second conductive layer is formed of opaque conductive material;
    forming a second insulation layer on the first substrate;
    forming contact holes exposing a portion of the source and drain regions by removing a portion of the first and second insulation layers and an open hole exposing a portion of the pixel electrode by removing the second conductive layer and the second insulation layer of an upper portion of the pixel electrode through a single photolithography process;
    forming a source electrode electrically connected to the source region through the contact hole;
    forming a drain electrode electrically connected to the drain region through the contact hole and directly connected to an upper surface of the pixel electrode,
    wherein an upper portion of an edge of the pixel electrode extends directly under the second insulation layer and is contact with the second insulation layer; and
    forming a liquid crystal layer between the first and second substrates.

2. The method of claim 1, wherein the active layer is formed as a silicon layer.

3. The method of claim 2, wherein the silicon layer is formed as a crystallized silicon film.

4. The method of claim 1, wherein the forming the gate electrode, the gate line and the pixel electrode comprises:
    forming a photosensitive film on the second conductive layer;
    forming a first photosensitive film pattern with a first thickness on a first region and a second photosensitive film pattern with a second thickness on a second region by applying a mask having a blocking region, a slit region and a transmission region;
    forming a gate electrode and a gate line on the first region of the first substrate and a pixel electrode on the second region by selectively removing the second and first conductive layers using the first and second photosensitive film patterns as a mask;
    forming a third photosensitive film pattern with a third thickness by removing the second photosensitive film pattern and substantially simultaneously removing a portion of the first photosensitive film pattern; and
    removing the second conductive layer on the pixel electrode of the second region using the third photosensitive film pattern as a mask.

5. The method of claim 4, wherein the second and first conductive layers are selectively removed using the first and second photosensitive film patterns to form a gate electrode and a gate line as a dual layer having the first and second conductive layers and a pixel electrode formed of the first conductive layer with the second conductive layer remaining thereon.

6. The method of claim 4, wherein the slit mask has a slit pattern at the slit region for blocking a portion of light so as to form the second photosensitive film pattern with the second thickness thinner than the first thickness on the second region.

7. The method of claim 4, wherein, in case of using a positive type of photosensitive film, the blocking region of the slit mask is applied to the first region and the slit region of the slit mask is applied to the second region.

8. The method of claim 4, wherein, in case of using a negative type of photosensitive film, the transmission region of the slit mask is applied to the first region and the slit region of the slit mask is applied to the second region.

9. The method of claim 4, wherein the second photosensitive film pattern removes through an ashing process.

10. The method of claim 9, wherein a portion of the first photosensitive film pattern is removed through the ashing process as high as the thickness of the second photosensitive film pattern to form a third photosensitive film pattern with a third thickness.

11. The method of claim 1, wherein the first or second conductive layer is formed of one of indium tin oxide (ITO) and indium zinc oxide (IZO).

12. The method of claim 1, wherein the second conductive layer is formed of one of aluminum, an aluminum alloy, tungsten, copper, chrome and molybdenum.

13. The method of claim 1, further comprising forming source and drain regions by implanting an impurity ion to a region of the active layer using the gate electrode as a mask after forming the gate electrode.

* * * * *